(12) United States Patent
Takenaga et al.

(10) Patent No.: US 10,504,803 B2
(45) Date of Patent: Dec. 10, 2019

(54) SUBSTRATE PROCESSING SYSTEM, CONTROL DEVICE, AND FILM DEPOSITION METHOD AND PROGRAM

(71) Applicant: Tokyo Electron Limited, Tokyo (JP)

(72) Inventors: Yuichi Takenaga, Yamanashi (JP); Takahito Kasai, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/936,952

(22) Filed: Mar. 27, 2018

(65) Prior Publication Data

US 2018/0286767 A1    Oct. 4, 2018

(30) Foreign Application Priority Data

Mar. 28, 2017 (JP) ................... 2017-063792

(51) Int. Cl.
| | | |
|---|---|---|
| G05B 15/02 | (2006.01) |
| H01L 21/66 | (2006.01) |
| H01L 21/02 | (2006.01) |
| C23C 16/52 | (2006.01) |
| G05B 19/18 | (2006.01) |
| C23C 16/458 | (2006.01) |
| H01L 21/67 | (2006.01) |

(52) U.S. Cl.
CPC .......... *H01L 22/20* (2013.01); *C23C 16/4583* (2013.01); *C23C 16/52* (2013.01); *G05B 19/188* (2013.01); *H01L 21/0262* (2013.01); *H01L 21/02532* (2013.01); *G05B 2219/40066* (2013.01); *H01L 21/67017* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 2003/0045961 A1* | 3/2003 | Nakao | ............... | H01L 21/67253 |
| | | | | 700/121 |
| 2003/0073293 A1* | 4/2003 | Ferro | .................. | C23C 16/4405 |
| | | | | 438/478 |

(Continued)

FOREIGN PATENT DOCUMENTS

JP        2009-081260 A        4/2009

*Primary Examiner* — Jason Lin
(74) *Attorney, Agent, or Firm* — Abelman, Frayne & Schwab

(57) ABSTRACT

Disclosed is a substrate processing system that performs a film deposition on plural substrates in a processing container using a film deposition condition calculated based on a characteristic of a film deposited on at least one of the substrates. The substrate processing system includes: a storage unit storing surface state information and arrangement state information that represent influences of a surface state of the one substrate and an arrangement state of the plural substrates on the characteristic of the film deposited on the one substrate, respectively; a calculation unit calculating information that represents an influence of the plural substrates on the characteristic of the film on the one substrate based on the surface state information and the arrangement state information stored in the storage unit; and a correction unit correcting the characteristic of the film deposited on the one substrate based on the information calculated by the calculation unit.

11 Claims, 3 Drawing Sheets

(56) References Cited

U.S. PATENT DOCUMENTS

| | | | |
|---|---|---|---|
| 2005/0136657 A1* | 6/2005 | Yokoi | C23C 16/34 438/680 |
| 2015/0243566 A1* | 8/2015 | Arai | H01L 22/12 438/14 |
| 2015/0354947 A1* | 12/2015 | Kondo | G01B 11/303 356/600 |

* cited by examiner

SUBSTRATE PROCESSING SYSTEM, CONTROL DEVICE, AND FILM DEPOSITION METHOD AND PROGRAM

CROSS-REFERENCE TO RELATED APPLICATION

This application is based on and claims priority from Japanese Patent Application No. 2017-063792 filed on Mar. 28, 2017 with the Japan Patent Office, the disclosure of which is incorporated herein in its entirety by reference.

TECHNICAL FIELD

The present disclosure relates to a substrate processing system, a control device, and a film deposition method and program.

BACKGROUND

In the related art, in a semiconductor manufacturing process, a substrate processing apparatus for processing a substrate such as a semiconductor wafer, for example, a vertical heat treatment apparatus is used. In a vertical heat treatment apparatus, a holder for holding a plurality of wafers in a shelf-like state is disposed in a vertical heat treatment furnace, and film deposition is performed on a substrate by a CVD processing, an ALD processing, or the like.

In such a substrate processing apparatus, a dummy wafer is disposed in order to improve the uniformity of product wafers (see, e.g., Japanese Patent Laid-Open Publication No. 2009-081260). As for the dummy wafer, for example, an unprocessed wafer or a processed wafer is used.

SUMMARY

An aspect of the present disclosure provides a substrate processing system that performs a film deposition processing on a plurality of substrates accommodated in a processing container using a film deposition condition calculated based on a characteristic of a film deposited on at least one substrate among the plurality of substrates. The substrate processing system includes: a storage unit configured to store surface state information that represents an influence of a surface state of the substrate on the characteristic of the film deposited on the at least one substrate and arrangement state information that represents an influence of an arrangement state of the plurality of substrates in the processing container on the characteristic of the film deposited on the at least one substrate; a calculation unit configured to calculate information that represents an influence of the plurality of substrates on the characteristic of the film on the at least one substrate based on the surface state information and the arrangement state information stored in the storage unit; and a correction unit configured to correct the characteristic of the film deposited on the at least one substrate based on the information calculated by the calculation unit.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
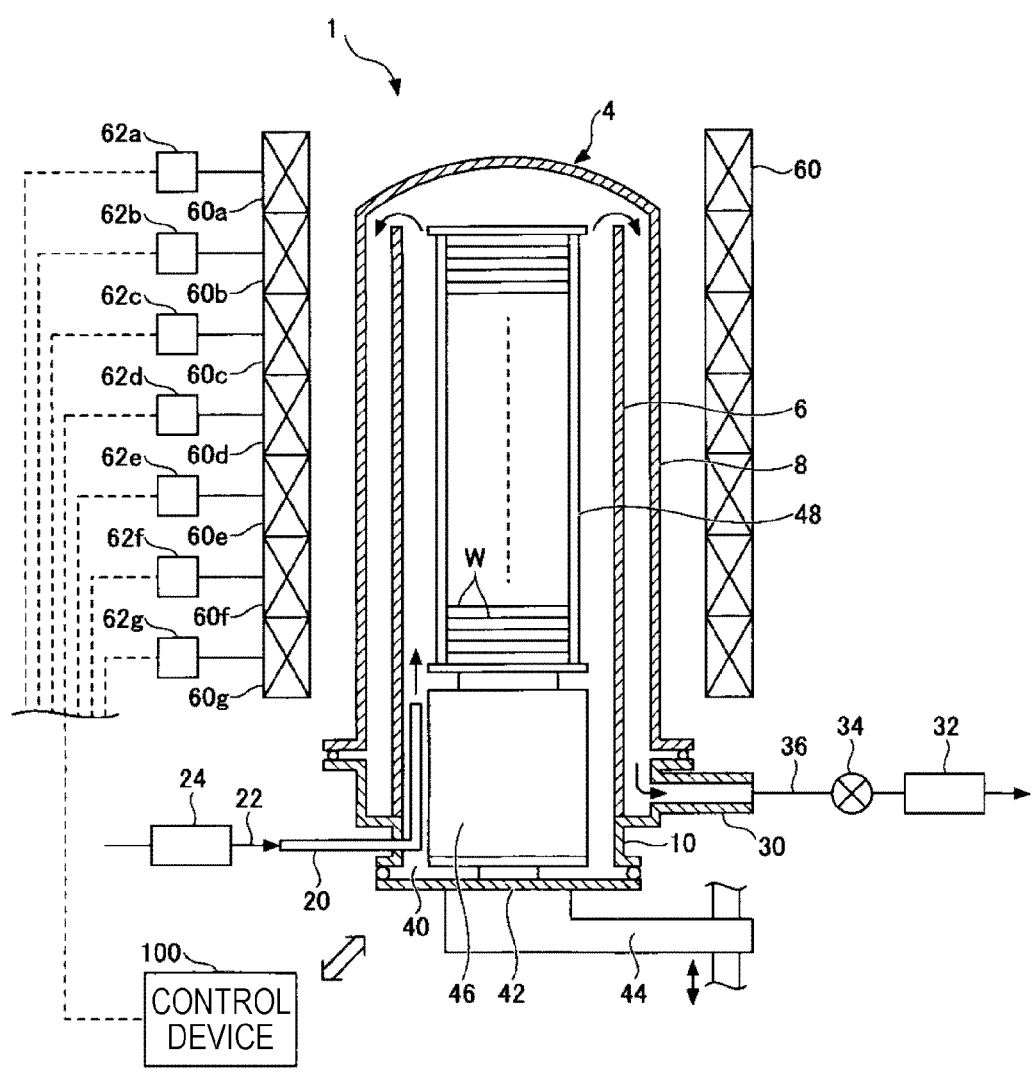
FIG. 1 is a schematic cross-sectional view of a substrate processing system according to an exemplary embodiment of the present disclosure.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

When an unprocessed wafer is used as a dummy wafer, a new unprocessed wafer is prepared each time a product wafer is processed, thereby increasing the manufacturing cost of semiconductor devices. In the meantime, the use of a processed wafer as a dummy wafer may influence the film thickness of the product wafer. This is due to the fact that the consumption amount of a reaction gas varies depending on the surface condition of a wafer. When a film deposition processing is performed in this way, it may be influenced by disturbance.

The present disclosure has been made in consideration of the foregoing and provides a substrate processing system in which a film deposition processing is performed by removing the influence of disturbances.

An aspect of the present disclosure provides a substrate processing system that performs a film deposition processing on a plurality of substrates accommodated in a processing container using a film deposition condition calculated based on a characteristic of a film deposited on at least one substrate among the plurality of substrates. The substrate processing system includes: a storage unit configured to store surface state information that represents an influence of a surface state of the substrate on the characteristic of the film deposited on the at least one substrate and arrangement state information that represents an influence of an arrangement state of the plurality of substrates in the processing container on the characteristic of the film deposited on the at least one substrate; a calculation unit configured to calculate information that represents an influence of the plurality of substrates on the characteristic of the film on the at least one substrate based on the surface state information and the arrangement state information stored in the storage unit; and a correction unit configured to correct the characteristic of the film deposited on the at least one substrate based on the information calculated by the calculation unit.

In the above-described substrate processing system, the surface state information includes film type information that represents a type of the film deposited on the substrate.

In the above-described substrate processing system, the surface state information includes surface area information that represents a surface area of the substrate.

In the above-described substrate processing system, the arrangement state information includes information on a number of substrates that represents the number substrates disposed on a path from a gas introducing portion which supplies a gas into the processing container to the at least one substrate.

In the above-described substrate processing system, assuming that correction coefficients obtained by digitizing information representing an influence of the film type information and the surface area information on the characteristic of the film deposited on the at least one substrate are $a_k$ and $b_k$ (k is an integer), respectively, and the number of the substrates disposed on the path from the gas introducing portion to the at least one substrate is n, a correction value obtained by digitizing the information representing the influence of the plurality of substrates on the characteristic of the film on the at least one substrate is calculated by Equation 1 as follows.

$$\sum_{k=1}^{n}(a_k \times b_k) \quad \text{[Equation 1]}$$

In the above-described substrate processing system, the arrangement state information includes adjacent film type information representing a type of a film deposited on a substrate adjacent to a surface of a side on which a film deposition is performed on the at least one substrate.

In the above-described substrate processing system, assuming that a correction coefficient obtained by digitizing the adjacent film type information is c, a correction value obtained by digitizing the information representing the influence of the plurality of substrates on the characteristic of the film on the at least one substrate is calculated by Equation 2 as follows.

$$\sum_{k=1}^{n}(a_k \times b_k) + c \quad \text{[Equation 2]}$$

In the above-described substrate processing system, the at least one substrate is a monitor substrate provided for monitoring a characteristic of a film to be deposited on a product substrate.

A control device according to the aspect of the present disclosure is a control device that controls a substrate processing apparatus configured to perform a film deposition processing on a plurality of substrates accommodated in a processing container using a film deposition condition calculated based on a characteristic of a film deposited on at least one substrate among the plurality of substrates. The substrate processing apparatus includes: a storage unit configured to store surface state information that represents an influence of a surface state of the substrate on the characteristic of the film deposited on the at least one substrate and arrangement state information that represents an influence of an arrangement state of the plurality of substrates in the processing container on the characteristic of the film deposited on the at least one substrate; a calculation unit configured to calculate information that represents an influence of the plurality of substrates on the characteristic of the film on the at least one substrate based on the surface state information and the arrangement state information stored in the storage unit; and a correction unit configured to correct the characteristic of the film deposited on the at least one substrate based on the information calculated by the calculation unit.

An aspect of the present disclosure provides a film deposition method of performing a film deposition processing on a plurality of substrates accommodated in a processing container using a film deposition condition calculated based on a characteristic of a film deposited on at least one substrate among the plurality of substrates. The film deposition method includes: calculating information that represents an influence of the plurality of substrates on the characteristic of the film on the at least one substrate based on surface state information that represents an influence of a surface state of the substrate on the characteristic of the film deposited on the at least one substrate and arrangement state information that represents an influence of an arrangement state of the plurality of substrates in the processing container on the characteristic of the film deposited on the at least one substrate; and correcting the characteristic of the film deposited on the at least one substrate based on the information calculated by the calculating.

According to the aspect of the present disclosure, there is provided a non-transitory computer-readable storage medium storing a computer executable program that, when executed, causes a computer to perform the above-described film deposition method.

According to the substrate processing system of the present disclosure, the film deposition processing may be performed by removing the influence of disturbances.

Hereinafter, modes for implementing the present disclosure will be described with reference to the accompanying drawings. In the drawings, substantially the same components are denoted by the same reference numerals, and a repeated description thereof will be omitted.

(Substrate Processing System)

The substrate processing system of the present disclosure will be described. FIG. 1 is a schematic cross-sectional view of the substrate processing system according to an exemplary embodiment of the present disclosure.

As illustrated in FIG. 1, the substrate processing system includes a substrate processing apparatus 1 and a control device 100.

The substrate processing apparatus 1 is, for example, a batch type apparatus that is capable of collectively performing a film deposition processing on a plurality of substrates accommodated in a processing container 4. The substrates may be, for example, semiconductor wafers (hereinafter, referred to as "wafers W").

The control device 100 is, for example, a computer and includes a central processing unit (CPU), a random access memory (RAM), a read only memory (ROM), an auxiliary storage device, and the like. The CPU is operated based on a program stored in the ROM or the auxiliary storage device, and controls the operation of the substrate processing apparatus 1. The control device 100 may be provided inside or outside the substrate processing apparatus 1. When the control device 100 is provided outside the substrate processing apparatus 1, the control device 100 may control the substrate processing apparatus 1 by a wired or wireless communication unit. Further, the control device 100 may also be connected to a group controller or a host computer which is a control device for collectively managing a plurality of devices including the substrate processing apparatus 1 by a wired or wireless communication unit.

(Substrate Processing Apparatus)

As illustrated in FIG. 1, the substrate processing apparatus 1 has a substantially cylindrical processing container 4 of which the longitudinal direction is vertical. The processing container 4 has a double pipe structure including an inner cylinder 6 and an outer cylinder 8 having a ceiling arranged concentrically outside the inner cylinder 6. The inner cylinder 6 and the outer cylinder 8 are formed of, for example, a heat-resistant material such as quartz.

The lower ends of the inner cylinder 6 and the outer cylinder 8 are held by a manifold 10 formed of stainless steel or the like. The manifold 10 is fixed, for example, to a base plate (not illustrated). Further, since the manifold 10, the inner cylinder 6, and the outer cylinder 8 form an inner space of a substantially cylindrical shape, these components are assumed to form a portion of the processing container 4. That is, the processing container 4 includes an inner cylinder 6 and an outer cylinder 8 formed of, for example, a heat-resistant material such as quartz, and a manifold 10 formed of stainless steel or the like, and the manifold 10 is provided below the side surface of the processing container 4 so as to hold the inner cylinder 6 and the outer cylinder 8 from below.

The manifold 10 has a gas introducing portion 20 that introduces various gases such as a film deposition gas used for a film deposition processing, a processing gas such as an additive gas, and a purging gas used for purging, into the processing container 4. FIG. 1 illustrates a configuration in which one gas introducing portion 20 is provided. However, the present disclosure is not limited to this, and a plurality of gas introducing portions 20 may be provided depending on the type of a gas to be used or the like.

The type of the processing gas is not particularly limited, and may be selected as appropriate depending on the type of a film to be deposited. The processing gas may be, for example, a silicon-containing gas.

The type of the purging gas is not particularly limited, and, for example, an inert gas such as nitrogen ($N_2$) gas may be used.

An introducing pipe 22 that introduces various gases into the processing container 4 is connected to the gas introducing portion 20. Further, the introducing pipe 22 is provided with a flow rate adjusting unit 24 such as a mass flow controller for adjusting the gas flow rate and a valve (not illustrated).

Further, the manifold 10 has a gas exhaust unit 30 that evacuates the inside of the processing container 4. The gas exhaust unit 30 is connected to an exhaust pipe 36 including a vacuum pump 32 capable of controlling the decompression of the inside of the processing container 4, an opening degree variable valve 34, and the like.

A furnace opening 40 is formed in the lower portion of the manifold 10, and, for example, a disk-shaped lid 42 formed of stainless steel or the like is provided in the furnace opening 40. The lid 42 is provided so as to be movable up and down by, for example, an elevating mechanism 44 functioning as a boat elevator, and is configured to hermetically seal the furnace opening 40.

A heat insulating cylinder 46 made of, for example, quartz is installed on the lid 42. A wafer boat 48 made of, for example, quartz, which holds, for example, about 50 to 175 wafers W in a horizontal state at a predetermined interval in multiple stages, is disposed on the heat insulating cylinder 46.

The wafer boat 48 is loaded (carried) into the processing container 4 by raising the lid 42 using the elevating mechanism 44, and various film deposition processings are performed on the wafers W held in the wafer boat 48. After the various film deposition processings are performed, the lid 42 is lowered using the elevating mechanism 44, so that the wafer boat 48 is unloaded (carried out) from the processing container 4 to the lower loading area.

For example, a cylindrical heater 60 capable of heating the processing container 4 to a predetermined temperature in a controlled manner is provided on the outer peripheral side of the processing container 4.

The heater 60 is divided into a plurality of zones, and the heaters 60a to 60g are provided from the upper side to the lower side in the vertical direction. The heaters 60a to 60g are configured to independently control the calorific values by power controllers 62a to 62g, respectively. In addition, a temperature sensor (not illustrated) corresponding to the heaters 60a to 60g, respectively, is provided on the inner wall of the inner cylinder 6 and/or the outer wall of the outer cylinder 8. Further, FIG. 1 illustrates the heater 60 divided into seven zones. However, the present disclosure is not limited to this, and the heater 60 may be divided into six or less zones or eight or more zones from the upper side to the lower side in the vertical direction. Also, the heater 60 may not be divided into a plurality of zones.

The plurality of wafers W disposed on the wafer boat 48 constitute one batch, and various film deposition processings are performed in one batch unit. The plurality of wafers W include product wafers Wp as product substrates, monitor wafers Wm as monitor substrates, and dummy wafers Wd as dummy substrate.

The product wafers Wp are wafers W used for manufacturing semiconductor devices. The product wafers Wp may be wafers on which an underlying film is deposited, or unprocessed wafers on which an underlying film is not deposited.

The monitor wafers Wm are wafers for monitoring the thicknesses of the films deposited on the product wafers Wp. For the purpose of satisfying the conditions, for example, wafers W which are substantially the same as the product wafers Wp are used. The monitor wafers Wm may be arranged to correspond to the divided heaters 60a to 60g, respectively. Thus, since it is possible to measure the film thickness for each zone, it is possible to control inter-surface uniformity with high accuracy.

The dummy wafers Wd are disposed in order to improve the uniformity of product wafers Wp. That is, there is a possibility that the film thickness of product wafers Wp in the vicinity of the upper and lower ends of the wafer boat 48 may be different from that of the other wafers W because the wafers W in the vicinity of the upper and lower ends of the wafer boat 48 form a boundary between the stacked wafers W and the outside. The film thickness uniformity among the product wafers Wp (inter-wafer uniformity) is secured by disposing the dummy wafers Wd near the upper and lower ends of the wafer boat 48.

In the substrate processing apparatus 1 in which a plurality of wafers are held in a shelf-like state so as to collectively perform a film deposition processing, a distribution in the concentration of the film deposition gas supplied from the gas introducing portion 20 occurs due to disturbances such as the surface states, the surface areas, the arrangement state (layout) of the wafers W, and the state of the inner cylinder 6.

Specifically, the film deposition gas is supplied from a gas inlet of the gas introducing portion 20 disposed at the lower portion of the inner cylinder 6, and is discharged from the upper portion of the inner cylinder 6. While the film deposition gas moves from the lower portion to the upper portion of the inner cylinder 6, the film deposition gas is consumed in the film deposition in the wafers W, and the concentration thereof decreases. As a result, the concentration of the film deposition gas near the gas inlet (the lower portion of the inner cylinder 6) is large, and the concentration of the film deposition gas decreases as the distance from the gas inlet becomes farther. Thus, the concentration of the film deposition gas at a portion far from the gas inlet (the upper portion of the inner cylinder 6) becomes smaller. Therefore, depending on the concentration distribution of the film deposition gas, the film thickness of the wafers W also tends to become thicker near the gas inlet (the film deposition rate become larger) and thinner at the portion far away from the gas inlet (the film deposition rate becomes smaller). The distribution of the gas concentration at this time differs depending on the distance from the gas inlet and the conditions on the gas path (the surface state of the wafers W, the surface area, the state of the inner cylinder 6, or the like). The concentration of the film deposition gas near the gas inlet (the lower portion of the inner cylinder 6) is a little influenced by these conditions and the concentration of the film deposition gas at the portion far away from the gas inlet (the upper portion of the inner cylinder 6) is greatly influenced by these conditions. As described above, the surface state of the wafers W disposed on the path of the film deposition gas influences the concentration distribution of the film deposition gas and the thickness of the film deposited on the wafers W (the film thickness uniformity among the wafers).

Also, the consumption amount of gas differs between the unprocessed wafers Wn and the processed wafers Wy. Generally, the film deposition rate is small in the unprocessed wafers Wn, and the film deposition rate is large in the processed wafers Wy. This is due to the affinity between a material constituting the film and a material constituting the surfaces of the wafers W. When the material constituting the surfaces of the wafers W is the same as the material constituting the film (the wafers W are processed wafers Wy), a conversion from the film deposition gas into the film is performed quickly (the film deposition rate is large) due to the affinity between the materials, and the consumption amount of the film deposition gas also becomes larger. In the meantime, when the material constituting the surfaces of the wafers W is different from the material constituting the film (the wafers W are unprocessed wafers Wn), the conversion from the film deposition gas into the film becomes slower (the film deposition rate is small), and the consumption amount of the film deposition gas also becomes smaller. As a result, when the unprocessed wafers Wn are stacked, the concentration distribution of the film deposition gas and the film thickness distribution between the wafers become smaller (the film thickness uniformity among the wafers is good). In the meantime, when the processed wafers Wy are stacked, the concentration distribution of the reaction gas and the film thickness distribution among the wafers become larger (the film thickness uniformity among the wafers is poor).

Hereinafter, the specific configuration of the control device 100 according to the exemplary embodiment of the present disclosure, which enables the film deposition processing to be performed by removing the influence of disturbances, will be described below.

(Control Device)

Figure 2:
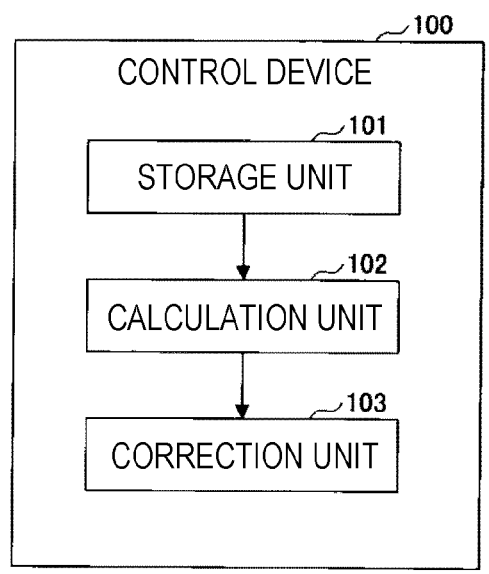
FIG. 2 is a view for explaining a functional configuration of a control device according to the exemplary embodiment of the present disclosure.

The control device 100 according to the exemplary embodiment of the present disclosure will be described. FIG. 2 is a view for explaining a functional configuration of the control device according to the exemplary embodiment of the present disclosure.

As illustrated in FIG. 2, the control device 100 has a storage unit 101, a calculation unit 102, and a correction unit 103.

The storage unit 101 stores surface state information and arrangement state information.

The surface state information is information that represents the influence of the surface state of the wafers W on the characteristic of the film deposited on one wafer W (e.g., a monitor wafer Wm or a product wafer Wp). The characteristic of the film may be, for example, the film thickness and the concentration of the impurity in the film. The surface state information includes film type information that represents the type of the film deposited on the wafers W and surface area information that represents the surface area of the wafers W. The film type information may be a film type correction coefficient determined in accordance with the type of the underlying film, for example, for the film to be deposited, and is determined by a preliminary experiment or the like. Specifically, for example, assuming that the film type correction coefficient is 1 when the type of the film to be deposited is the same as the type of the underlying film, the film type correction coefficient may be set to a value smaller than 1 when the type of the film to be deposited is different from that of the underlying film. The surface area information may be, for example, the surface area correction coefficient determined in accordance with the surface area of the wafers W, and is determined through a preliminary experiment or the like. Specifically, assuming that the surface area correction coefficient is 1 when no concavo-convex pattern is formed on the surfaces of the wafers W, the surface area correction may be set to a value greater than 1 when the concavo-convex pattern such as a trench pattern or a hole pattern is formed on the surfaces of the wafers W. In addition, as the surface area of the wafers W increases, the surface area correction coefficient may be set to a larger value.

The arrangement state information is information that represents the influence of the arrangement state of the wafers W in the processing container 4 on the characteristic of the film deposited in one wafer W (e.g., a monitor wafer Wm or a product wafer Wp). Specifically, the arrangement state information may be information that represents the number of wafers W disposed on the path from the gas inlet of the gas introducing portion 20, which supplies gas into the processing container 4, to one wafer W. For example, in the substrate processing apparatus 1 illustrated in FIG. 1, when the wafers W are disposed on all the slots of the wafer boat 48, and a monitor wafer Wm as one wafer W is disposed as the tenth wafer from the bottom, the number of wafers W disposed on the path from the gas inlet of the gas introducing portion 20 to the monitor inlet Wm is nine. That is, information on the number of wafers becomes nine. The arrangement state information may also include information of the surface area of the wafers W adjacent to the surface of the side on which the film deposition is performed in one wafer W, and the adjacent film type information that represents the type of the film deposited on the adjacent wafer W.

The calculation unit 102 calculates information representing the influence of the plurality of wafers W on the characteristic of the film of one wafer W based on the surface state information and the arrangement state information stored in the storage unit 101. Specifically, assuming that the film type correction coefficient and the surface area correction coefficient, which are the correction coefficients obtained by digitizing the information representing the influence of the film type information and the surface state information on the characteristic of the film deposited on one wafer W, are $a_k$ and $b_k$ (k is an integer), respectively, and the number of wafers W on the path is n, the calculation unit 102 calculates a correction value obtained by digitizing information representing the influence of the plurality of wafers W on the characteristic of the film of one wafer W by Equation 1 as follows.

$$\sum_{k=1}^{n}(a_k \times b_k) \qquad \text{[Equation 1]}$$

Further, when the arrangement state information includes the adjacent film type information and the correction coefficient obtained by digitizing the adjacent film type information is c, the calculation unit 102 calculates the influence of the plurality of wafers W on the characteristic of the film of one wafer W by Equation 2 as follows.

$$\sum_{k=1}^{n}(a_k \times b_k) + c \qquad \text{[Equation 2]}$$

Based on the information calculated by the calculation unit 102, the correction unit 103 corrects the actually measured value of the characteristic of the film deposited on one wafers W. Thus, the characteristic of the film deposited on one wafer W may be corrected to the characteristic from which the influence of the disturbances is removed. Therefore, it is possible to perform the film deposition processing on the plurality of wafers W using the film deposition condition calculated based on the characteristic from which the influence of the disturbances is removed. As a result, the characteristic of the film deposited on the wafers W may be controlled with high accuracy.

(Disturbance Removal Processing)

Figure 3:
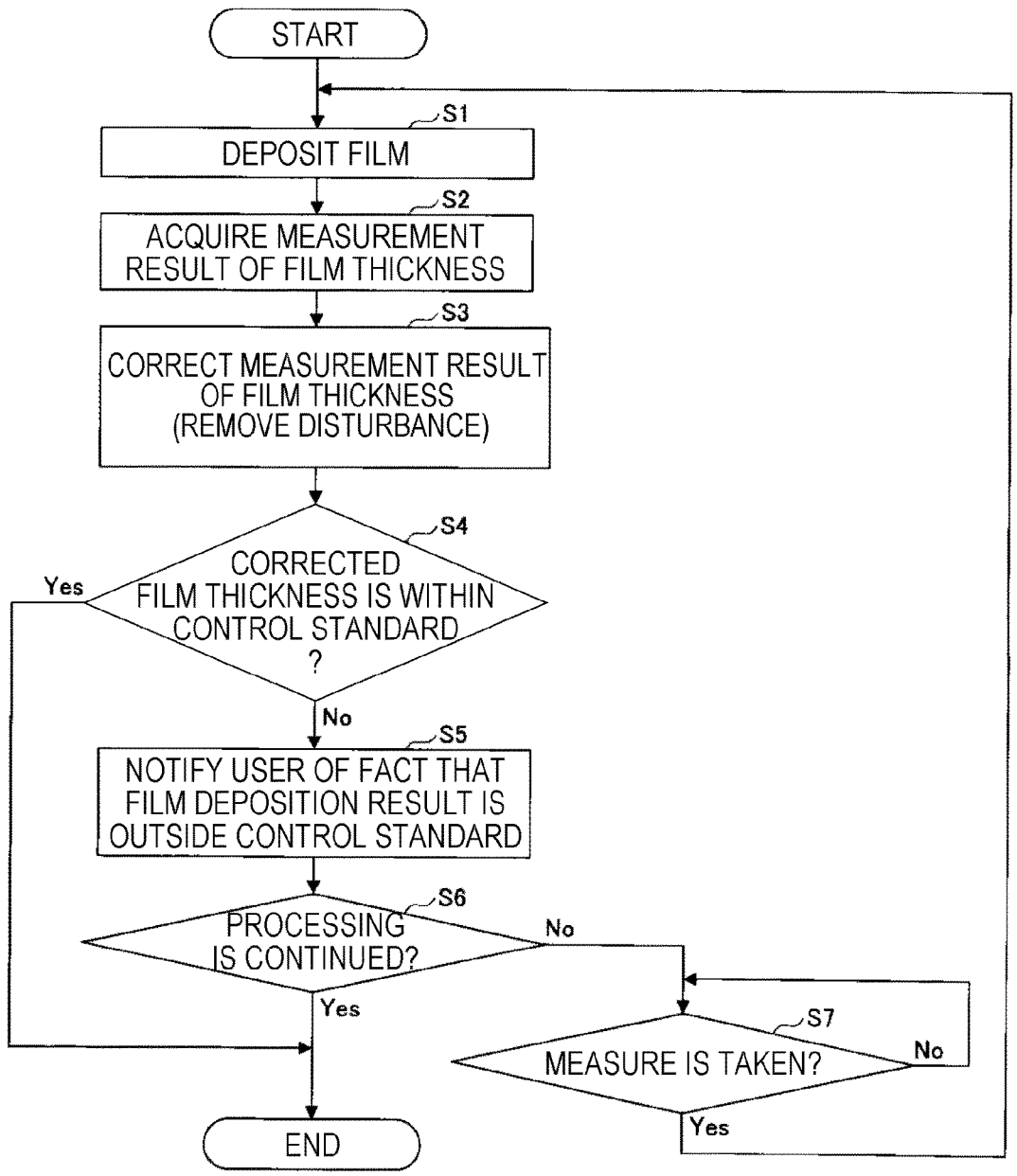
FIG. 3 is a flowchart illustrating an example of a disturbance removal processing according to the exemplary embodiment of the present disclosure.

The disturbance removal processing according to the exemplary embodiment of the present disclosure will be described. FIG. 3 is a flowchart illustrating an example of a disturbance removal processing according to the exemplary embodiment of the present disclosure.

Hereinafter, a description will be made of a case where the above-described substrate processing apparatus 1 is used to dispose the wafers W on all the slots of the wafer boat 48, one of the wafers W is used as a monitor wafer Wm, and the film deposition process is performed on a plurality of wafers W using the film deposition condition calculated based on the thickness of the film deposited on the monitor wafer Wm.

When the film deposition condition is selected by a user or the like and the operation of the film deposition processing is performed, the control device 100 initiates the disturbance removal processing illustrated in the flowchart of FIG. 3. The film deposition condition includes the target film thickness.

First, the control device 100 performs a film deposition processing on a plurality of wafers W based on the film deposition condition selected by the user or the like (step S1). The control device 100 also measures the thickness of the film deposited on the monitor wafer Wm.

Next, the control device 100 acquires the measurement result of the thickness of the film deposited on the monitor wafer Wm (step S2).

Next, the control device 100 corrects the measurement result of the film thickness (step S3). Specifically, the calculation unit 102 calculates information representing the influence of the plurality of wafers W on the film thickness of one wafers W based on the surface state information that represents the influence of the surface state of the wafers W stored in the storage unit 101 on the thickness of the film deposited on one wafer W, and the arrangement state information that represents the influence of the arrangement state of the wafers W in the processing container 4 on the thickness of the film deposited on one wafer W. Subsequently, the correction unit 103 calculates the actually measured thickness of the film deposited on one wafer W based on the information representing the influence of the plurality of wafers W calculated by the calculation unit 102 on the film thickness of one wafer W. In this way, it is possible to calculate the film thickness from which the influence of disturbances such as the surface state and the arrangement state of a plurality of wafers W disposed on the wafer boat 48 is removed.

Next, the control device 100 determines whether the film thickness corrected in step S3 is within the control standards (step S4). The control standards are determined according to the film deposition condition or the like, and may be, for example, the target film thickness±10% or ±5%.

When it is determined in step S4 that the corrected film thickness is within the control standards, the control device 100 terminates the processing. In the meantime, when it is determined in step S4 that the corrected film thickness is outside the control standards, the control device 100 notifies the user that the film deposition result is outside the control standards (step S5). When a notification has been received that the film deposition result is outside the control standards, the user or the like may determine whether to continue the processing.

In step S6, the control device 100 determines whether an operation for continuing the processing from the user or the like has been received.

When it is determined in step S6 that the operation for continuing the processing has been received, the control device 100 terminates the processing. In the meantime, when it is determined in step S6 that the operation for continuing the processing has not been received, the control device 100 determines whether the user or the like has taken measures (step S7).

When it is determined in step S7 that the user or the like has taken measures, the control device 100 proceeds to step S1. In the meantime, when it is determined that no measure has been taken by the user or the like, the control device 100 repeats step S7 again.

As described above, in the present exemplary embodiment of the present disclosure, information that represents the influence of a plurality of wafers W on the characteristic of the film on one wafer W is calculated based on the surface state information and the arrangement state information, and the characteristic of the film deposited on one wafer W is corrected based on the calculated information. Therefore, even when disturbances such as a change in the surface state of the wafer W to be used or the number of wafers W disposed on the wafer boat 48 occur, it is possible to acquire the characteristic of the film from which the disturbances are removed. This eliminates the need for work (step) of coating the dummy wafer Wd, thereby reducing the costs, labor, and time required to manufacture the semiconductor device.

In addition, due to the elimination of disturbances from the film deposition results, the monitoring accuracy of the film deposition results is improved, and false alarms (erroneous detection) during monitoring are less likely to occur.

In addition, when performing feedback control using the film deposition results, it is possible to control the processing with high accuracy (adjust the processing results).

The modes for implementing the present disclosure have been described above. However, the foregoing descriptions do not limit the contents of the disclosure, and various modifications and improvements may be made within the scope of the present disclosure.

In the above-described exemplary embodiment, a case where the control device 100 controlling the operation of the substrate processing apparatus 1 performs the disturbance removal processing has been described as an example, but the present disclosure is not limited to this. For example, a group controller or a host computer connected to the control device 100 by a wired or wireless communication unit may perform the disturbance removal processing.

In the above-described exemplary embodiment, a description has been made of a case where the actually measured characteristic value of the film is corrected by digitizing the influence of the surface state of the wafer W and the arrangement state of the wafer W in the processing container 4 on the characteristic of the film deposited on one wafer W, but the present disclosure is not limited to this. For example, in addition to this influence, by digitizing the influence of the state of the inner cylinder 6 (the cumulative film thickness of the surface of the inner cylinder 6), the presence or absence of the pre-cleaning of the monitor wafer Wm, the underlying film deposited on the monitor wafer Wm, the elapsed time after the cleaning of the product wafer Wp, or the like on the characteristic of the film deposited on one wafer W, the actually measured characteristic of the film may be corrected.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing system that performs a film deposition processing on a plurality of substrates accommodated in a processing container, the substrate processing system comprising:
    a memory configured to store surface state information that represents an influence of a surface state of at least one substrate on a characteristic of a film deposited on the at least one substrate among the plurality of substrates and arrangement state information that represents an influence of an arrangement state of the plurality of substrates in the processing container on the characteristic of the film deposited on the at least one substrate; and
    a processor coupled to the memory and configured to:
    calculate information that represents an influence of the plurality of substrates on the characteristic of the film on the at least one substrate based on the surface state information and the arrangement state information stored in the storage unit; and
    correct the characteristic of the film deposited on the at least one substrate based on the calculated information that represents the influence of the plurality of substrates on the characteristic of the film on the at least one substrate.

2. The substrate processing system of claim 1, wherein the surface state information includes film type information that represents a type of the film deposited on the substrate.

3. The substrate processing system of claim 2, wherein the surface state information includes surface area information that represents a surface area of the substrate.

4. The substrate processing system of claim 3, wherein the arrangement state information includes information on a number of substrates that represents the number of substrates disposed on a path from a gas introducing portion which supplies a gas into the processing container to the at least one substrate.

5. The substrate processing system of claim 4, wherein, assuming that correction coefficients obtained by digitizing information representing an influence of the film type information and the surface area information on the characteristic of the film deposited on the at least one substrate are $a_k$ and $b_k$ (k is an integer), respectively, and the number of the substrates disposed on the path from the gas introducing portion to the at least one substrate is n, a correction value obtained by digitizing the information representing the influence of the plurality of substrates on the characteristic of the film on the at least one substrate is calculated by Equation 1 as follows $$\sum_{k=1}^{n} (a_k \times b_k). \qquad \text{[Equation 1]}$$

6. The substrate processing system of claim 1, wherein the arrangement state information includes adjacent film type information representing a type of a film deposited on a substrate adjacent to a surface of a side on which a film deposition is performed on the at least one substrate.

7. The substrate processing system of claim 6, wherein assuming that a correction coefficient obtained by digitizing the adjacent film type information is c, a correction value obtained by digitizing the information representing the influence of the plurality of substrates on the characteristic of the film on the at least one substrate is calculated by Equation 2 as follows $$\sum_{k=1}^{n} (a_k \times b_k) + c. \qquad \text{[Equation 2]}$$

8. The substrate processing system of claim 1, wherein the at least one substrate is a monitor substrate provided for monitoring a characteristic of a film to be deposited on a product substrate.

9. A controller configured to control a substrate processing apparatus, the substrate processing apparatus configured to perform a film deposition processing on a plurality of substrates accommodated in a processing container, the controller comprising:
    a memory configured to store surface state information that represents an influence of a surface state of at least one substrate on a characteristic of a film deposited on the at least one substrate among the plurality of substrates and arrangement state information that represents an influence of an arrangement state of the plurality of substrates in the processing container on the characteristic of the film deposited on the at least one substrate; and
    a processor coupled to the memory and configured to:
    calculate information that represents an influence of the plurality of substrates on the characteristic of the film on the at least one substrate based on the surface state information and the arrangement state information stored in the memory; and correct the characteristic of the film deposited on the at least one substrate based on the calculated information that represents an influence of the plurality of substrates on the characteristic of the film on the at least one substrate.

10. A film deposition method of performing a film deposition processing on a plurality of substrates accommodated in a processing container using a film deposition condition calculated based on a characteristic of a film deposited on at least one substrate among the plurality of substrates, the film deposition method comprising:

calculating information that represents an influence of the plurality of substrates on the characteristic of the film on the at least one substrate based on surface state information that represents an influence of a surface state of the substrate on the characteristic of the film deposited on the at least one substrate and arrangement state information that represents an influence of an arrangement state of the plurality of substrates in the processing container on the characteristic of the film deposited on the at least one substrate; and correcting the characteristic of the film deposited on the at least one substrate based on the information calculated by the calculating.

11. A non-transitory computer-readable storage medium storing a computer executable program that, when executed, causes a computer to perform the film deposition method of claim 10.

* * * * *